(12) United States Patent
Hill et al.

(10) Patent No.: US 11,359,916 B2
(45) Date of Patent: Jun. 14, 2022

(54) DARKFIELD IMAGING OF GRATING TARGET STRUCTURES FOR OVERLAY MEASUREMENT

(71) Applicant: KLA Corporation

(72) Inventors: Andrew V. Hill, Berkley, CA (US); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/996,328

(22) Filed: Aug. 18, 2020

(65) Prior Publication Data

US 2021/0072021 A1  Mar. 11, 2021

Related U.S. Application Data

(60) Provisional application No. 63/036,760, filed on Jun. 9, 2020, provisional application No. 62/897,548, filed on Sep. 9, 2019.

(51) Int. Cl.
*G01B 11/27* (2006.01)
*G06T 7/00* (2017.01)

(52) U.S. Cl.
CPC .......... *G01B 11/272* (2013.01); *G06T 7/0004* (2013.01); *G01B 2210/56* (2013.01); *G06T 2207/10152* (2013.01); *G06T 2207/30148* (2013.01)

(58) Field of Classification Search
CPC . G01B 11/272; G01B 2210/56; G06T 7/0004; G06T 2207/10152; G06T 2207/30148
See application file for complete search history.

(56) References Cited

U.S. PATENT DOCUMENTS

| 9,478,496 B1* | 10/2016 | Lin ..................... H01L 25/0657 |
| 10,379,445 B2 | 8/2019 | Jak et al. |
| 2013/0278942 A1 | 10/2013 | Jeong et al. |
| 2017/0176871 A1 | 6/2017 | Buel et al. |
| 2017/0184977 A1* | 6/2017 | Jak ....................... G02B 5/1823 |
| 2018/0373166 A1 | 12/2018 | Sanguinetti et al. |
| 2019/0004220 A1 | 1/2019 | Hsieh et al. |

OTHER PUBLICATIONS

PCT International Search Report and Written Opinion for International Application No. PCT/US2020/048668 dated Dec. 7, 2020, 10 pages.

* cited by examiner

*Primary Examiner* — Jamil Ahmed
(74) *Attorney, Agent, or Firm* — Suiter Swantz pc llo

(57) ABSTRACT

A metrology system may include an illumination sub-system to illuminate a metrology target on a sample with illumination having a symmetric off-axis illumination profile, where the symmetric off-axis illumination profile is symmetric along one or more measurement directions, and where the illumination sub-system provides illumination from opposing angles in the symmetric off-axis illumination profile at least one of simultaneously or sequentially. The metrology target may include a first periodic structure on a first layer of the sample and a second periodic structure on a second layer of the sample. The metrology system may further include an imaging sub-system to generate images of the metrology target formed using two non-zero diffraction orders from each point of the symmetric off-axis illumination profile. The metrology subsystem may further determine an overlay error indicative of alignment between the first layer and the second layer based on the one or more images.

31 Claims, 12 Drawing Sheets

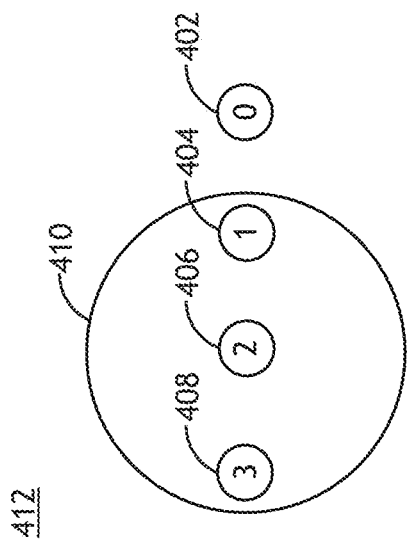
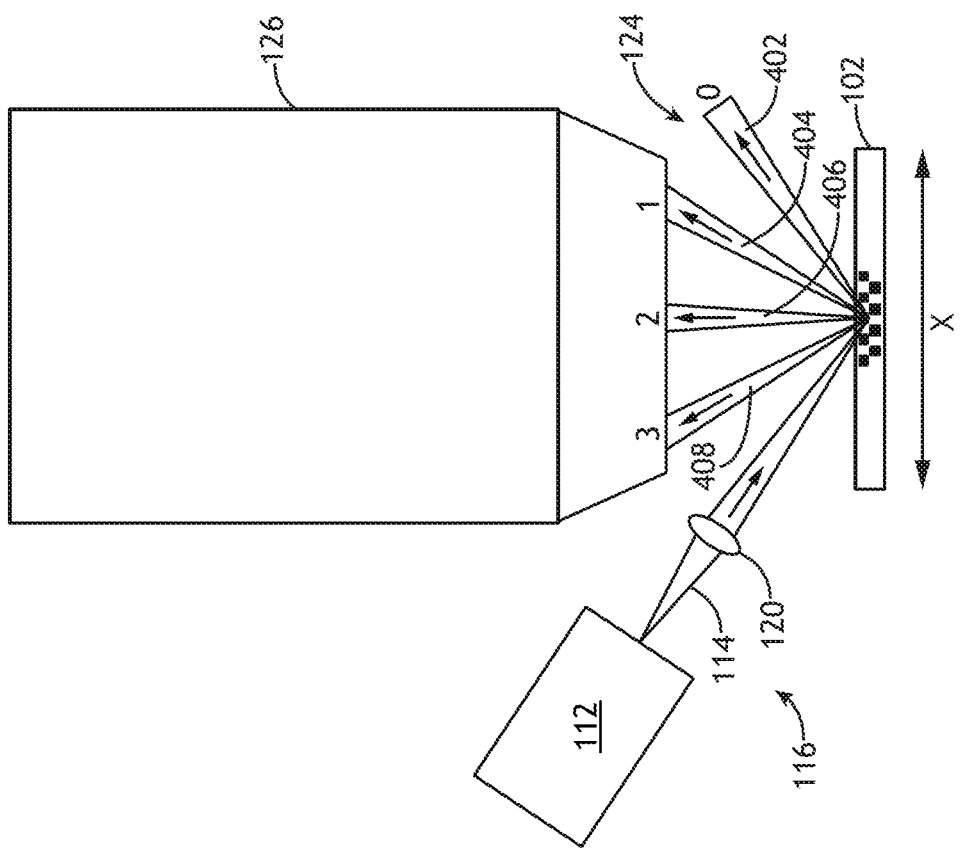

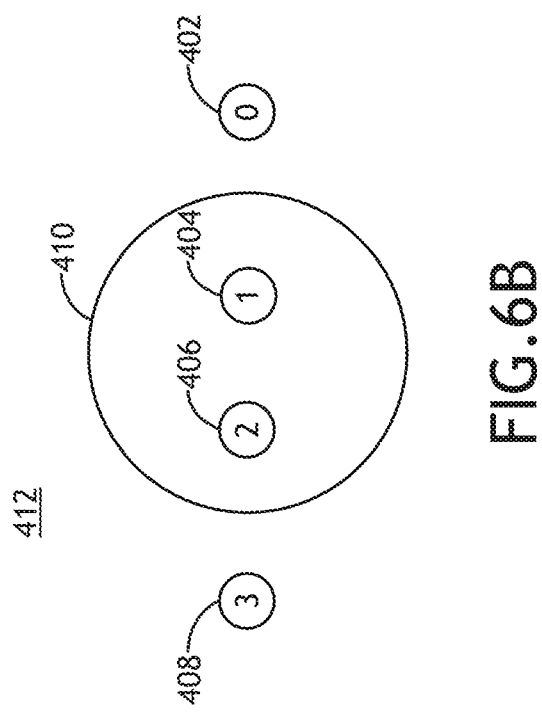
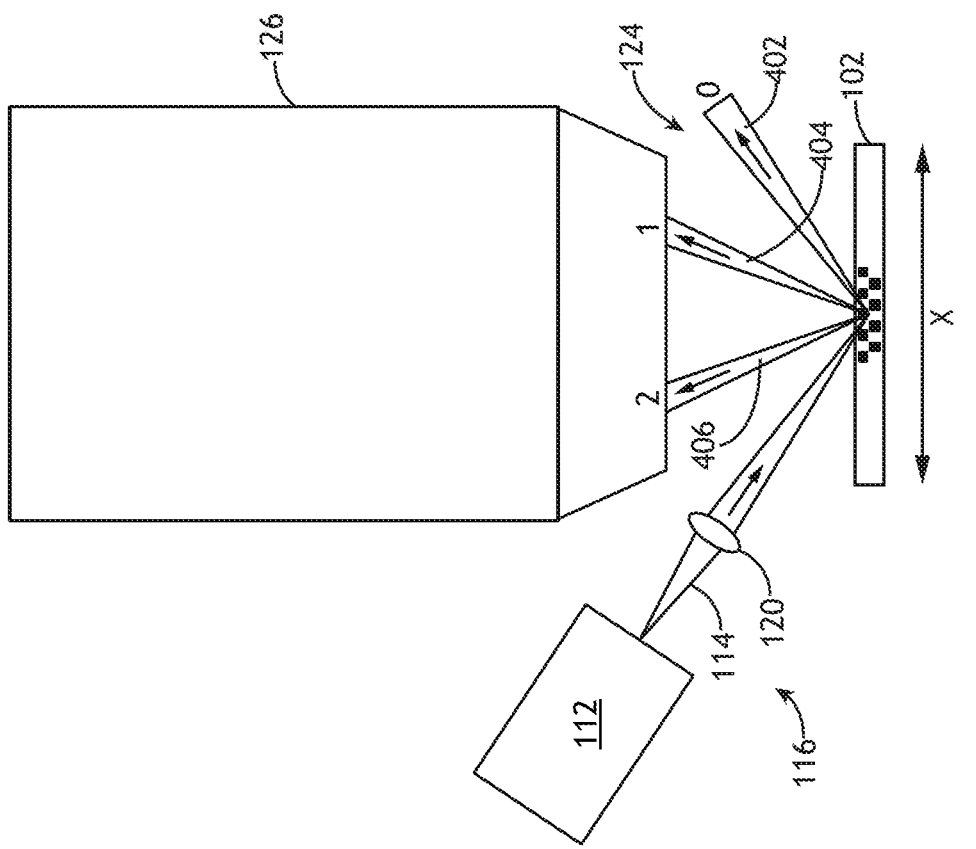
FIG.6B
FIG.6A

DARKFIELD IMAGING OF GRATING TARGET STRUCTURES FOR OVERLAY MEASUREMENT

CROSS-REFERENCE TO RELATED APPLICATION

The present application claims the benefit under 35 U.S.C. § 119(e) of U.S. Provisional Application Ser. No. 62/897,548 filed Sep. 9, 2019, entitled DARKFIELD IMAGING OF GRATING TARGET STRUCTURES FOR OVERLAY MEASUREMENT OF BONDED WAFERS, naming Andrew Hill and Amnon Manassen as inventors; and U.S. Provisional Application Ser. No. 63/036,760 filed Jun. 9, 2020, entitled DARKFIELD IMAGING OF GRATING TARGET STRUCTURES FOR OVERLAY MEASUREMENT OF BONDED WAFERS, naming Andrew Hill and Amnon Manassen as inventors, both of which are incorporated herein by reference in the entirety.

TECHNICAL FIELD

The present disclosure relates generally to overlay metrology and, more particularly, to darkfield imaging of periodic target structures for overlay metrology.

BACKGROUND

Image-based overlay metrology systems typically generate overlay measurements based on a bright-field image of a metrology target. However, bright-field images are typically sensitive to aberrations in an imaging system. As a result, overlay measurements are also sensitive to the aberrations. Therefore, it would be desirable to provide a system and method for providing overlay metrology that is robust to optical aberrations.

SUMMARY

A metrology system is disclosed in accordance with one or more illustrative embodiments of the present disclosure. In one illustrative embodiment, the system includes an illumination sub-system to illuminate a metrology target with illumination having a symmetric off-axis illumination profile, where the symmetric off-axis illumination profile is symmetric along one or more measurement directions, and where the illumination sub-system provides illumination from opposing angles in the symmetric off-axis illumination profile at least one of simultaneously or sequentially. In another illustrative embodiment, the metrology target includes a first periodic structure on a first layer of the sample and a second periodic structure on a second layer of the sample. In another illustrative embodiment, the system includes an imaging sub-system to generate one or more images of the metrology target formed using two non-zero diffraction orders from each point of the symmetric off-axis illumination profile. In another illustrative embodiment, the system includes a controller to receive the one or more images of the metrology target from the imaging sub-system associated with the illumination of the metrology target with the symmetric off-axis illumination profile and determine an overlay error indicative of alignment between the first layer and the second layer based on the one or more images.

A metrology system is disclosed in accordance with one or more illustrative embodiments of the present disclosure. In one illustrative embodiment, the system includes a multi-channel illumination source to generate two or more illumination beams, wherein the two or more illumination beams are arranged to illuminate a metrology target on a sample in a symmetric off-axis illumination profile, where the two or more illumination beams are oriented to be symmetric along one or more measurement directions, and where the illumination sub-system provides illumination from opposing illumination beams forming the symmetric off-axis illumination profile at least one of simultaneously or sequentially. In another illustrative embodiment, the metrology target includes a first periodic structure on a first layer of the sample and a second periodic structure on a second layer of the sample. In another illustrative embodiment, the system includes an objective lens configured to collect light from the metrology target in response to the illumination beams. In another illustrative embodiment, the system includes an imaging sub-system to generate one or more images of the metrology target based on two non-zero diffraction orders from each of the two or more illumination beams. In another illustrative embodiment, the system includes a controller to receive the one or more images of the metrology target from the imaging sub-system and determine an overlay error indicative of alignment between the first layer and the second layer based on the one or more images.

A metrology method is disclosed in accordance with one or more illustrative embodiments of the present disclosure. In one illustrative embodiment, the method includes illuminating a metrology target on a sample with illumination having a symmetric off-axis illumination profile, where the symmetric off-axis illumination profile is symmetric along one or more measurement directions, and where the illumination sub-system provides illumination from opposing angles in the symmetric off-axis illumination profile at least one of simultaneously or sequentially. In another illustrative embodiment, the metrology target includes a first periodic structure on a first layer of the sample and a second periodic structure on a second layer of the sample. In another illustrative embodiment, the method includes generating one or more images of the metrology target based on two non-zero diffraction orders from each point of the symmetric off-axis illumination profile in response to the illumination. In another illustrative embodiment, the method includes determining, with one or more processors, an overlay error indicative of alignment of the first wafer and the second layer based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 5A is a conceptual view of the imaging tool configured to collect three symmetric diffraction orders from an overlay target associated with a first azimuthal angle oriented along an X direction, in accordance with one or more embodiments of the present disclosure.

FIG. 5B is a top view of a distribution of diffracted orders in a collection pupil of the imaging tool configured according to FIG. 5A, in accordance with one or more embodiments of the present disclosure.

FIG. 6A is a conceptual view of the imaging tool configured to collect two symmetric diffraction orders from an overlay target associated with a first azimuthal angle oriented along the X direction, in accordance with one or more embodiments of the present disclosure.

FIG. 6B is a top view of a collection pupil of the imaging tool configured according to FIG. 6A, in accordance with one or more embodiments of the present disclosure.

DETAILED DESCRIPTION

Figure 1A:
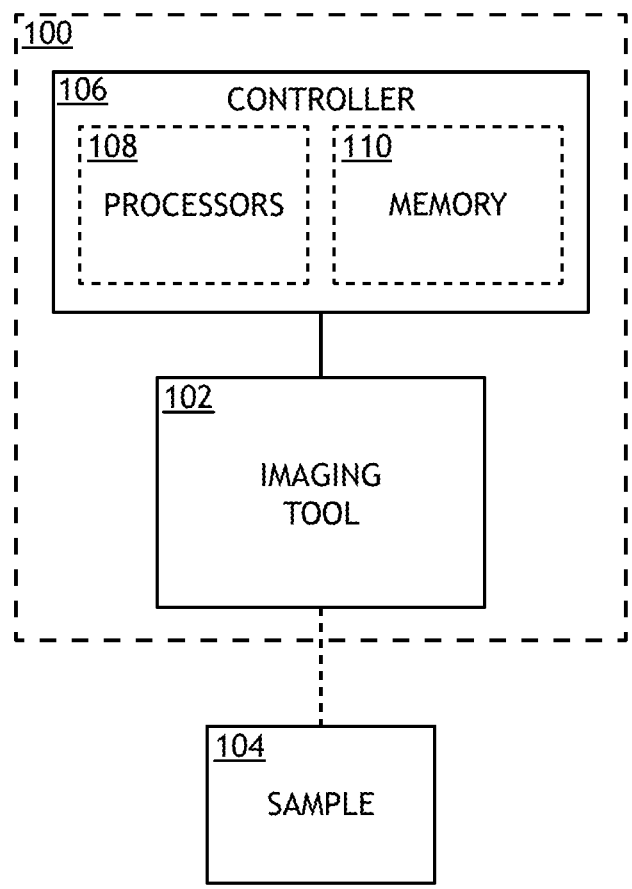
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to overlay metrology based on dark-field imaging of overlay targets with periodic features. In the context of the present disclosure, the term dark-field imaging is used to describe imaging based on diffracted or scattered light, and particularly excluding 0-order diffraction (specular reflection) from the overlay target. It is contemplated herein that various techniques may be utilized to perform imaging in this configuration and the term dark-field imaging herein should be interpreted broadly to extend to any type of system or technique suitable for imaging in this configuration.

In some embodiments of the present disclosure, an overlay metrology target includes target features associated with two or more layers of a sample. In this regard, relative positions of target features in a dark-field image may be indicative of an overlay error (e.g., a registration error) between the sample layers. Further, the sample layers of an overlay target may be located on one or more wafers. For example, a sample may be formed as two or more patterned layers on a single wafer. Accordingly, an overlay target including target features on two or more sample layers on the single wafer may provide overlay measurements between the two or more sample layers on the single wafer. By way of another example, a sample may be formed as two wafers bonded together at an interface, where each wafer may include multiple patterned layers near the interface (e.g., the inward facing sides of the wafers). Accordingly, an overlay target including target features on at least one sample layer of each wafer may provide an overlay measurement of the alignment of the two wafers during the bonding process.

It is contemplated herein that dark-field imaging of periodic features using a spatially and temporally coherent light may be relatively insensitive to optical aberrations compared to bright-field imaging and/or imaging with low-coherent illumination. Optical aberrations of an imaging system may be characterized by a variation of wavefront error across the pupil plane of the imaging system. Thus, limiting the extent of collected light across the pupil plane may limit the sensitivity of the imaging system to these optical aberrations.

The size and shape of diffraction orders from an overlay target as measured in a collection pupil of an imaging system may be influenced by the spatial and temporal coherence of illumination. For example, an illumination beam with relatively high spatial coherence may provide highly-localized diffraction orders having similar size and shape as the incident illumination beam. An illumination beam with relatively high temporal coherence, which may be achieved by limiting the spectral bandwidth of the illumination, may also provide localized diffraction orders in the collection pupil by limiting chromatic dispersion in the diffraction orders. In this regard, coherent dark-field imaging based on localized diffraction orders may limit the impact of optical aberrations in the imaging system by reducing the spatial extent of light in the collection pupil that contributes to an image and thus limiting the effect of wavefront error variations across the pupil.

In some embodiments, an overlay target is illuminated with symmetric illumination with respect to an overlay measurement direction. In some cases, symmetric illumination may facilitate accurate overlay measurements, particularly in the presence of asymmetries in the target or the imaging system. In the context of the present disclosure, symmetric illumination with respect to a particular direction, or axis, refers to off-axis illumination of the target from opposing azimuthal angles with respect to a surface normal. In this regard, the illumination may be said to have a symmetric off-axis illumination profile. Further, an illumination profile may be symmetric with respect to multiple directions. For example, dipole illumination may provide symmetric illumination along one measurement direction (e.g., an X direction or a Y direction), and quadrupole illumination may provide symmetric illumination with respect to two orthogonal measurement directions (e.g., X and Y directions). Similarly, an annular illumination profile may provide symmetric illumination with respect to all directions on the sample.

Further, symmetric illumination may be implemented by either simultaneous or sequential illumination of opposing azimuthal angles. For example, symmetric illumination in the context of this disclosure thus refers to the totality of illumination associated with one or more images associated with an overlay measurement rather than any particular illumination profile used to generate any particular image.

It is further contemplated herein that many optical aberrations such as, but not limited to, defocus and spherical aberration are symmetric around the optical axis of the system. In some embodiments, the overlay target and the imaging system are co-optimized such that the intensity distribution of collected light in the collection pupil is also symmetric. This configuration may further reduce the sensitivity to these optical aberrations since the light associated with the image is limited to portions of the collection pupil with similar wavefront errors. In some cases, the impact of this constant wavefront error may be algorithmically removed or otherwise mitigated to further limit the impact on the overlay measurement.

The overlay target and the imaging system may be co-optimized using a variety of techniques. For example, diffraction orders from the overlay target may be, but are not required to be, symmetrically distributed in the collection pupil. By way of another example, the combined intensity distribution of collected diffraction orders associated with the symmetric illumination (either through simultaneous or sequential techniques) may be symmetric. In this regard, any asymmetries introduced by illumination from one azimuthal angle may be offset by illumination from the opposing azimuthal angle.

Further, the distribution of diffracted orders from an overlay target in the collection pupil of an imaging system is generally a function of multiple parameters including, but not limited to, the period of the target features, the wavelength of illumination, the angle of illumination, and the numeric aperture (NA) of the imaging system. Accordingly, any combination of parameters of the overlay target or the imaging system may be selected to provide a selected distribution of diffraction orders in the pupil plane. Additionally, any of the above parameters may be fixed or variable. For example, the period of the target features and the measurement parameters of the dark-field imaging system (e.g., the illumination wavelength, the illumination angle of incidence, the NA, or the like) may be fixed for a given series of measurements. By way of another example, one or more measurement parameters of the dark-field imaging system may be adjustable. In this regard, the measurement parameters may be adjusted on the fly or as part of a recipe to flexibly adapt to a range of target periods.

In some embodiments of the present disclosure, target features on each sample layer of interest of an overlay target an overlay target, suitable for a common measurement are periodic with a common period. For example, target features may include, but are not limited to, line/space features having the common period. In this regard, the target features may have well-defined diffraction orders in a pupil plane of a dark-field imaging system.

The dark-field imaging system may generate images using any number of diffraction orders (e.g., two or more diffraction orders) from periodic target features of an overlay target. In some embodiments, the overlay target and the dark-field imaging system are co-optimized to generate images based on two symmetric diffraction orders. In this regard, the image of periodic target features may correspond to a sinusoid. It is further contemplated herein that the impact of optical aberrations on such an image may be primarily to decrease the contrast of the sinusoid in the image. However, in the case where an image is formed based on two symmetric diffraction orders that are localized in the pupil plane, the impact of symmetric aberrations on contrast may be relatively low. Accordingly, overlay metrology based on coherent dark-field imaging with two symmetric diffraction orders may be relatively insensitive to optical aberrations, particularly optical aberrations characterized by symmetric wavefront errors such as, but not limited to, defocus and spherical aberration.

It is further contemplated herein that dark-field imaging is relatively robust in the presence of specular reflection from the sample (e.g., from reflections at interfaces between different materials) since light reflected from the sample is not used to form the image of the sample.

It is further contemplated herein that coherent dark-field imaging with two symmetric diffraction orders may be well suited for, but not limited to, overlay on samples formed from bonded wafers. Target features of an overlay target on such a sample are on or near the interface between the two wafers. Imaging the overlay target requires propagating light through the thickness of both wafers (e.g., through both wafers in transmission-mode imaging and through a single wafer twice in reflection-mode imaging). For a sample formed from thick semiconductor wafers (e.g., approximately 0.75 mm) having a relatively high index of refraction, this configuration is particularly susceptible to optical aberrations. Further, reflections at the air/wafer interface may be strong (e.g., approximately 31% at normal incidence), which may provide a substantial 0-order signal. However, as described previously herein, coherent dark-field imaging with two symmetric diffraction orders may be relatively insensitive to both the associated aberrations and the substantial 0-order signal.

Referring now to FIGS. 1A through 7B, systems and methods for coherent dark-field imaging overlay are described in accordance with one or more embodiments of the present disclosure.

FIG. 1A is a conceptual view of an overlay metrology system 100, in accordance with one or more embodiments of the present disclosure. In one embodiment, the overlay metrology system 100 includes an imaging tool 102 to generate one or more dark-field images of a sample 104, or a portion thereof, based on non-zero diffracted orders from the sample 104. For example, the imaging tool 102 may generate dark-field images of an overlay target including features in two or more layers of the sample 104.

The imaging tool 102 may be suitable for generating dark-field images of a variety of overlay target designs on a variety of sample configurations. In one embodiment, the sample 104 is formed as two or more patterned layers on a single wafer. An overlay target including target features on two or more sample layers on the single wafer may thus provide overlay measurements between the two or more sample layers on the single wafer. In another embodiment, the sample 104 is formed as two wafers bonded together at an interface, where each wafer may include one or more patterned layers near the interface (e.g., the inward facing sides of the wafers). An overlay target including target features on at least one sample layer of each wafer may thus provide an overlay measurement of the alignment of the two wafers during the bonding process.

In another embodiment, the overlay metrology system 100 includes a controller 106 communicatively coupled to the imaging tool 102. The controller 106 may be configured to direct the imaging tool 102 to generate dark-field images based on one or more selected recipes. The controller 106 may be further configured to receive data including, but not limited to, dark-field images from the imaging tool 102. Additionally, the controller 106 may be configured to determine overlay associated with an overlay target based on the acquired dark-field images.

In another embodiment, the controller 106 includes one or more processors 108. For example, the one or more processors 108 may be configured to execute a set of program instructions maintained in a memory device 110, or memory. The one or more processors 108 of a controller 106 may include any processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 108 may include any device configured to execute algorithms and/or instructions (e.g., program instructions stored in memory). In one embodiment, the one or more processors 108 may be embodied as a desktop computer, mainframe computer system, workstation, image computer, parallel processor, networked computer, or any other computer system configured to execute a program configured to operate or operate in conjunction with the metrology system 100, as described throughout the present disclosure.

Further, the memory device 110 may include any storage medium known in the art suitable for storing program instructions executable by the associated one or more processors 108. For example, the memory device 110 may include a non-transitory memory medium. By way of another example, the memory device 110 may include, but is not limited to, a read-only memory (ROM), a random-access memory (RAM), a magnetic or optical memory device (e.g., disk), a magnetic tape, a solid-state drive and the like. It is further noted that memory device 110 may be housed in a common controller housing with the one or more processors 108. In one embodiment, the memory device 110 may be located remotely with respect to the physical location of the one or more processors 108 and controller 106. For instance, the one or more processors 108 of controller 106 may access a remote memory (e.g., server), accessible through a network (e.g., internet, intranet and the like).

The imaging tool 102 may be any type of imaging tool known in the art suitable for imaging using diffracted light and/or scattered light. Further, the imaging tool 102 may be configurable to generate dark-field images based on any number of recipes defining measurement parameters for the determining of overlay of an overlay target based on dark-field imaging. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

Figure 1B:
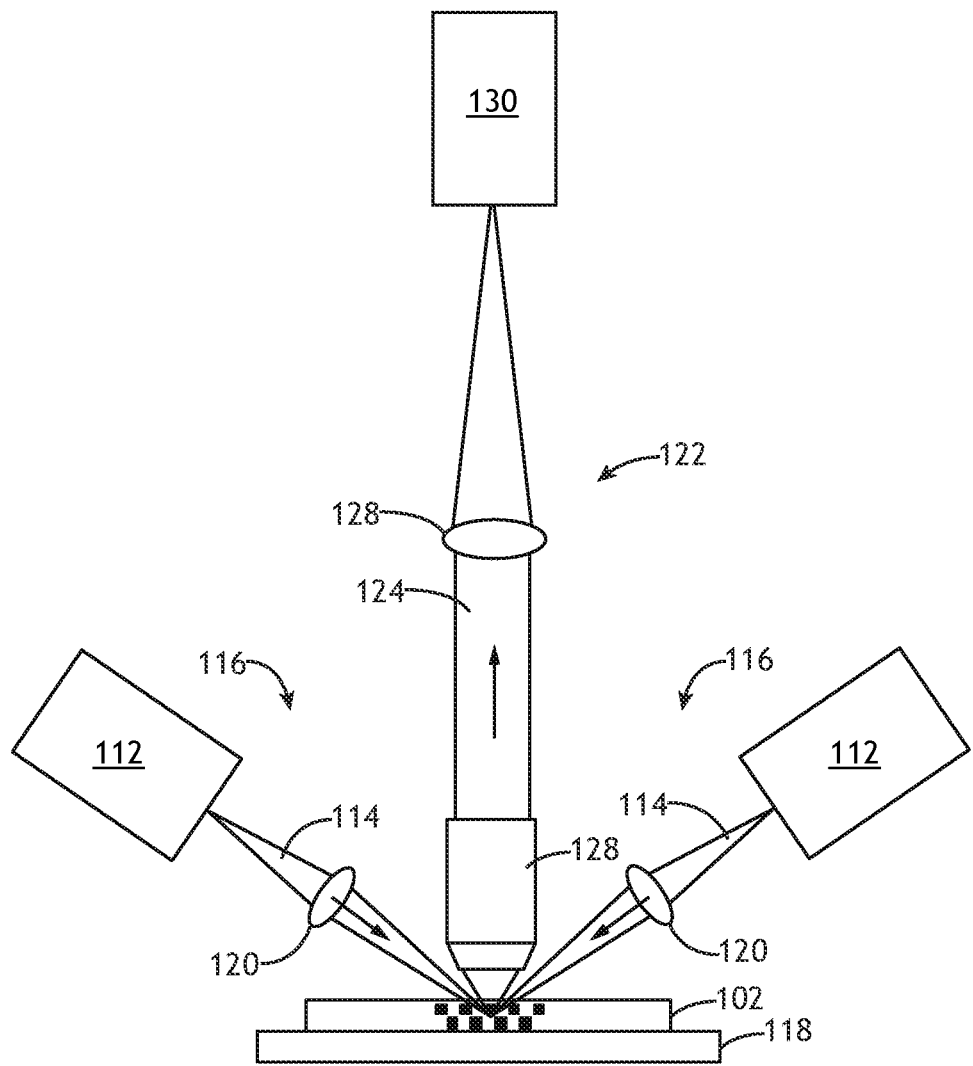
FIG. 1B is a conceptual view illustrating the dark-field imaging tool, in accordance with one or more embodiments of the present disclosure.

FIG. 1B is a conceptual view illustrating the imaging tool 102, in accordance with one or more embodiments of the present disclosure. In one embodiment, the imaging tool 102 includes an illumination source 112 configured to generate an illumination beam 114. The illumination beam 114 may include one or more selected wavelengths of light including, but not limited to, ultraviolet (UV) radiation, visible radiation, or infrared (IR) radiation.

The illumination source 112 may include any type of illumination source suitable for providing an illumination beam 114. In one embodiment, the illumination source 112 is a laser source. For example, the illumination source 112 may include, but is not limited to, one or more narrowband laser sources, a broadband laser source, a supercontinuum laser source, a white light laser source, or the like. In this regard, the illumination source 112 may provide an illumination beam 114 having high coherence (e.g., high spatial coherence and/or temporal coherence). In another embodiment, the illumination source 112 includes a laser-sustained plasma (LSP) source. For example, the illumination source 112 may include, but is not limited to, an LSP lamp, an LSP bulb, or an LSP chamber suitable for containing one or more elements that, when excited by a laser source into a plasma state, may emit broadband illumination. In another embodiment, the illumination source 112 includes a lamp source. For example, the illumination source 112 may include, but is not limited to, an arc lamp, a discharge lamp, an electrodeless lamp, or the like. In this regard, the illumination source 112 may provide an illumination beam 114 having low coherence (e.g., low spatial coherence and/or temporal coherence).

In another embodiment, the imaging tool 102 directs the illumination beam 114 to the sample 104 through one or more illumination channels 116. Further, the sample 104 may be disposed on a sample stage 118 suitable for securing the sample 104 and further configured to position the sample 104 with respect to the illumination beam 114.

Each illumination channel 116 may include one or more optical components suitable for modifying and/or conditioning the illumination beam 114 as well as directing the illumination beam 114 to the sample 104. For example, each illumination channel 116 may include, but is not required to include, one or more illumination lenses 120 (e.g., to control a spot size of the illumination beam 114 on the sample 104, to relay pupil and/or field planes, or the like), one or more polarizers to adjust the polarization of the illumination beam 114 in the channel, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the imaging tool 102 includes a collection pathway 122 for the collection of light from the sample 104 (e.g., sample light 124). In one embodiment, the collection pathway 122 includes an objective lens 126 to collect diffracted or scattered light from the sample 104. For example, the objective lens 126 may collect one or more diffracted orders of radiation from an overlay target on the sample 104 in response to the illumination beam 114. The collection pathway 122 may further include multiple optical elements to direct and/or modify illumination collected by the objective lens 126 including, but not limited to one or more lenses 128, one or more filters, one or more polarizers, one or more beam blocks, or one or more beamsplitters.

In another embodiment, the collection pathway 122 includes a detector 130 configured to generate an image (e.g., a dark-field image) of the sample 104. For example, a detector 130 may receive an image of the sample 104 provided by elements in the collection pathway 122 (e.g., the objective lens 126, the one or more lenses 128, or the like).

Figure 1C:
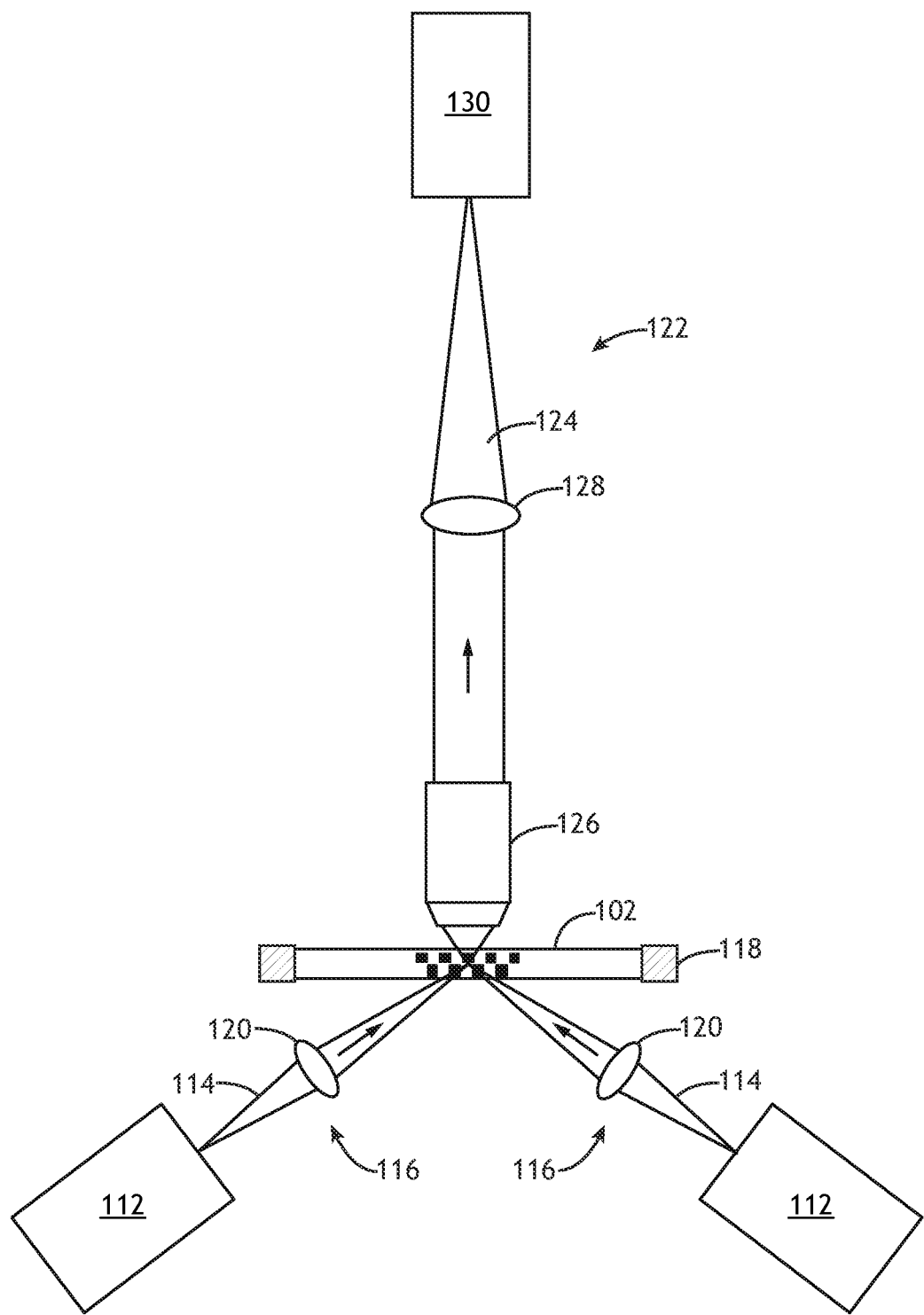
FIG. 1C is a conceptual view of the dark-field imaging tool configured for transmission-mode imaging, in accordance with one or more embodiments of the present disclosure.

It is contemplated herein that the illumination channels 116 and the collection pathway 122 of the imaging tool 102 may be oriented in a wide range of configurations suitable for generating a dark-field image of the sample 104. FIGS. 1B-1F illustrate non-limiting configurations of the imaging tool 102. In a general sense, the imaging tool 102 may be configured in a reflection mode (e.g., as illustrated in FIGS. 1B, 1C, 1D, 1E, and 1F) or a transmission mode (e.g., as illustrated in FIG. 1C). Further, the imaging tool 102 may block 0-order light (e.g., specular reflection or direct transmission) to achieve dark-field imaging using any technique known in the art. For example, the illumination channels 116 and the collection pathway 122 may be oriented such that the 0-order light is outside the numerical aperture (NA) of the objective lens 126 and is thus not captured by the objective lens 126. By way of another example, the illumination channels 116 and the collection pathway 122 may be oriented such that 0-order light is captured by the objective lens 126 but blocked by one or more stops or apertures (e.g., in the collection pathway 122).

FIG. 1C is a conceptual view of the imaging tool 102 configured for transmission-mode imaging, in accordance with one or more embodiments of the present disclosure. In one embodiment, at least one of the illumination channels 116 is oriented on an opposite side of the sample 104 as the objective lens 126 to provide transmission-mode imaging.

Figure 1D:
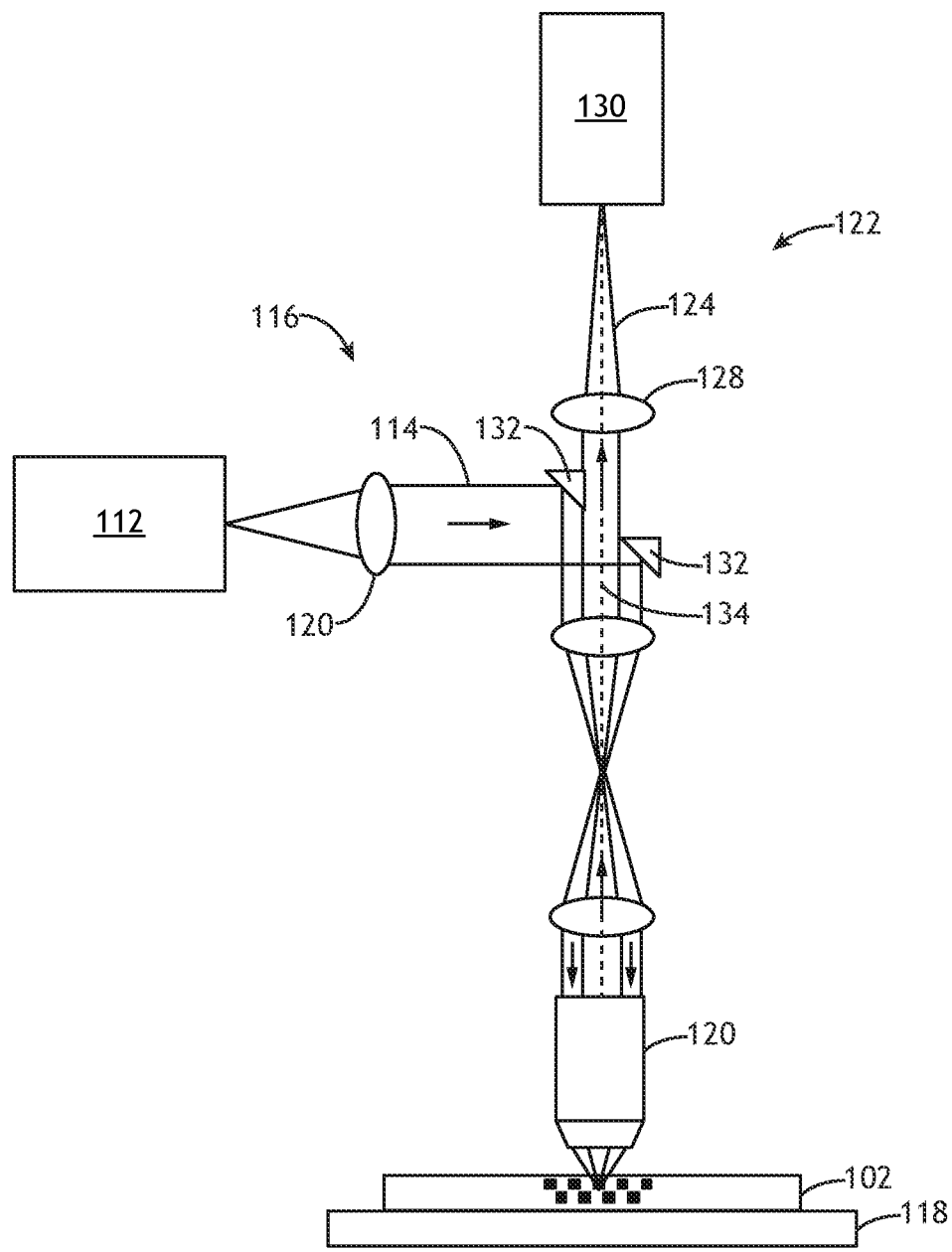
FIG. 1D is a conceptual view of the dark-field imaging tool configured for oblique TTL dark-field imaging, in accordance with one or more embodiments of the present disclosure.

As illustrated in FIGS. 1B and 1C, the imaging tool 102 may be configured in an outside-the-lens (OTL) configuration in which at least one of the illumination channels 116 includes an illumination lens 120 separate from the objective lens 126. Referring now to FIGS. 1D and 1E, in some embodiments, the imaging tool 102 is configured in a through-the-lens (TTL) configuration in which at least one of the illumination channels 116 is oriented to direct the illumination beam 114 through the objective lens 126.

FIG. 1D is a conceptual view of the imaging tool 102 configured for oblique TTL dark-field imaging, in accordance with one or more embodiments of the present disclosure. In one embodiment, the imaging tool 102 includes an off-axis mirror 132 (e.g., an annular mirror with an open aperture, or the like) to simultaneously direct the illumination beam 114 along a range of oblique solid angles and block sample light 124 collected by the objective lens 126 in this range of solid angles to provide dark-field imaging. Portions of the collected sample light 124 not blocked by the off-axis mirror 132 (e.g., near the optical axis 134) may then propagate to the detector 130 to form a dark-field image. The off-axis mirror 132 may be, but is not required to be, located at or near a pupil plane of the collection pathway 122. In this regard, the spatial dimensions of the off-axis mirror 132 in the pupil plane may directly correspond to the range of solid angles at which the illumination beam 114 is directed to the sample 104 and a range of solid angles of collected sample light 124 allowed to propagate to the detector 130 to form the dark-field image.

Further, although not shown, the imaging tool 102 may be configured to support both OTL and axial TTL dark-field imaging.

Referring now to FIGS. 2A through 7B, coherent dark-field overlay metrology is described in accordance with one or more embodiments of the present disclosure.

Figure 2A:
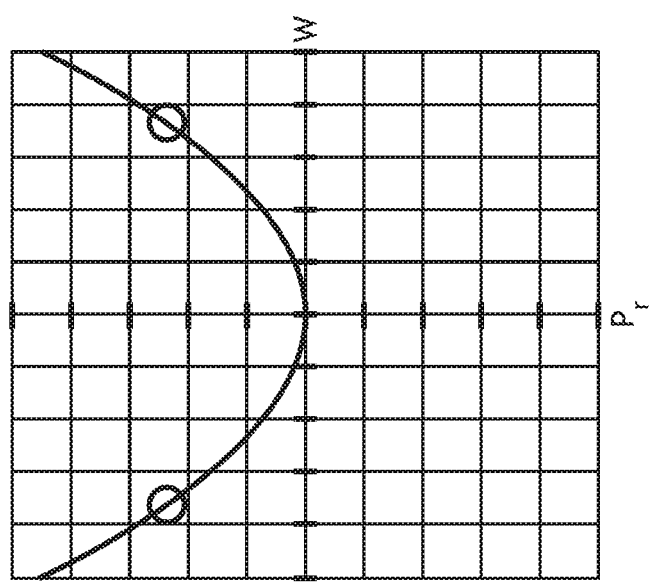
FIG. 2A is a plot of wavefront error associated with defocus across a collection pupil, in accordance with one or more embodiments of the present disclosure.
Figure 2B:
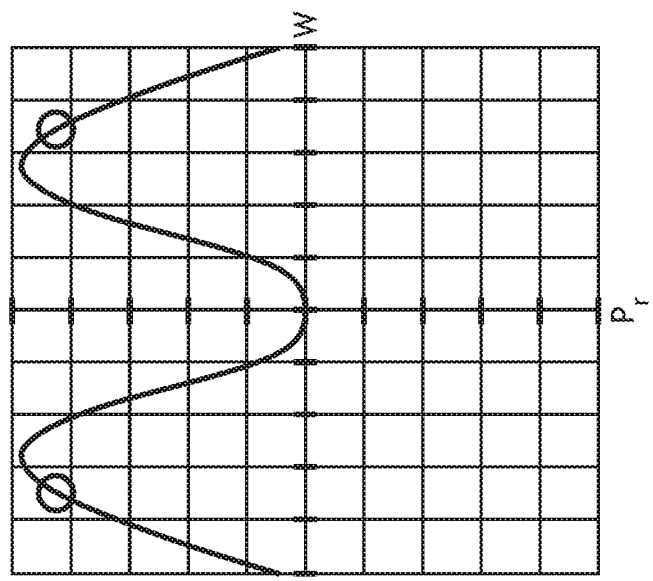
FIG. 2B is a plot of wavefront error associated with spherical aberration across a collection pupil, in accordance with one or more embodiments of the present disclosure.

Optical aberrations may manifest as a variation of the wavefront across a collection pupil of an imaging system. For example, wavefront errors associated with two common aberrations are shown in FIGS. 2A and 2B. FIG. 2A is a plot of wavefront error associated with defocus across a collection pupil of the imaging tool 102 along a radial direction r (e.g., the X direction or the Y direction), in accordance with one or more embodiments of the present disclosure. FIG. 2B is a plot of wavefront error associated with spherical aberration across a collection pupil of the imaging tool 102 along a radial direction r (e.g., the X direction or the Y direction), in accordance with one or more embodiments of the present disclosure.

Accordingly, light passing through different locations of the collection pupil (e.g., light emanating from the sample 104 at different angles) have different wavefronts such that the quality of the resulting image is diminished. For example, bright-field imaging may typically include a distribution of light across the entire pupil plane such that the impact of wavefront error variations across the pupil plane associated with aberrations (e.g., as illustrated in FIGS. 2A and 2B) may be high.

However, it is contemplated herein that imaging a periodic overlay target on the sample 104 based on non-zero diffraction orders as disclosed herein restricts the light used to generate the image of the sample 104 (e.g., an overlay target on the sample 104) to localized portions of the collection pupil. For example, non-zero diffraction orders may correspond to, but are not required to correspond, to the circled locations 202 in FIGS. 2A and 2B. In this way, the impact of wavefront errors (e.g., variations of the wavefront) across the collection pupil may be mitigated.

In contrast, an image based only on infinitesimally small symmetric points may be completely insensitive to aberrations with symmetric wavefront errors. While generation of an image based only on infinitesimally small symmetric points in the collection pupil may not be feasible, restricting an image to localized symmetric points in the collection pupil (e.g., as illustrated by the ovals in FIGS. 2A and 2B) may substantially mitigate aberrations in the resulting image. Accordingly, overlay measurements generated based on such images may also be relatively insensitive to these aberrations.

In one embodiment, imaging based on localized diffraction orders in a collection pupil is accomplished by imaging periodic overlay targets with an imaging system (e.g., the imaging tool 102), where the overlay target and the imaging system are co-optimized (or co-designed) to provide the desired diffraction orders in the collection pupil.

It is further contemplated herein that many optical aberrations such as, but not limited to, defocus and spherical aberration are symmetric around the optical axis 134 of the system. As illustrated in FIGS. 2A and 2B, symmetric points in the collection pupil (e.g., the circled regions 202) experience substantially equal amounts of wavefront error for such symmetric aberrations. As a result, the effective wavefront error may be substantially mitigated by generating an image with a symmetric pupil-plane distribution.

In one embodiment, the overlay target and the imaging system are co-optimized to provide a symmetric distribution of intensity in the collection pupil. As described above, this may be implemented using either simultaneous or sequential illumination with a symmetric illumination profile.

Figure 3:
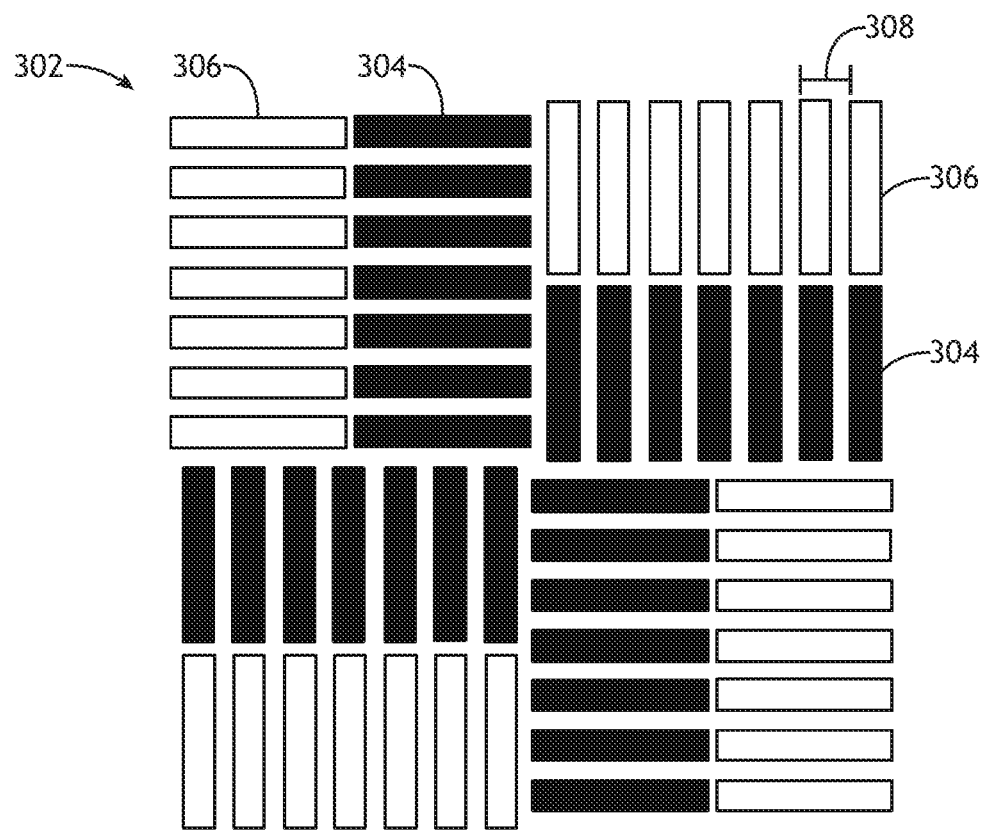
FIG. 3 is a top view of an overlay target, in accordance with one or more embodiments of the present disclosure.

FIG. 3 is a top view of an overlay target 302, in accordance with one or more embodiments of the present disclosure. In one embodiment, the overlay target 302 includes first-layer features 304 on a first layer of the sample 104 and second-layer features 306 on a second layer of the sample 104.

In one embodiment, each of the first-layer features 304 and the second-layer features 306 are formed from features having a common period 308. In this regard, diffraction orders from the first-layer features 304 and the second-layer features 306 may be collocated in the collection pupil.

It is contemplated herein that the distribution of overlay target features (e.g., the first-layer features 304 and the second-layer features 306) may vary based on the overlay algorithm used to determine overlay error associated with two or more layers of the sample 104. For example, the overlay target 302 illustrated in FIG. 3 corresponds to an advanced imaging overlay (AIM) overlay target in which the target features on each layer of the sample are rotationally symmetric (here symmetric about a 90° rotation). However, it is to be understood that the use of an AIM overlay target is provided solely for illustrative purposes and should not be interpreted as limiting. Rather, an overlay target 302 having any layout of periodic features on one or more sample layers is within the spirit and scope of the present disclosure.

The imaging tool 102 may generate images of the overlay target 302 using any number of non-zero diffraction orders from the periodic target features (e.g., the first-layer features 304 and/or the second-layer features 306). In one embodiment, the overlay target 302 and the imaging tool 102 are co-optimized to generate images based on two diffraction orders (e.g., first-order diffraction and second-order diffraction). In this regard, the image of periodic target features may correspond to a sinusoid. It is further contemplated herein that the impact of optical aberrations on such an image may be primarily to decrease the contrast of the sinusoid in the image. However, in the case where an image is formed based on two diffraction orders that are localized in the pupil plane, the impact of aberrations on the contrast of the sinusoid may be relatively low as described previously herein.

Figure 4A:
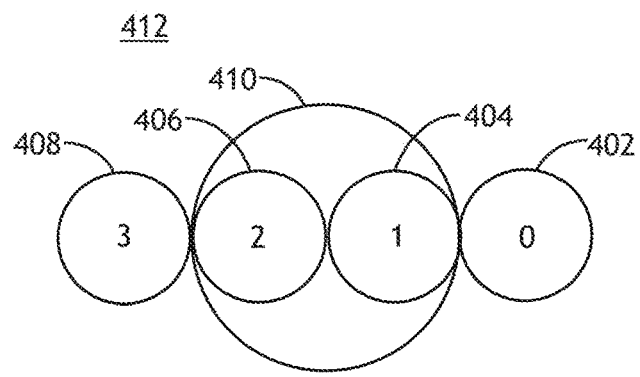
FIG. 4A is a top view of a collection pupil illustrating diffraction orders generated based on an illumination beam with relatively high temporal coherence and relatively low spatial coherence, in accordance with one or more embodiments of the present disclosure.
Figure 4B:
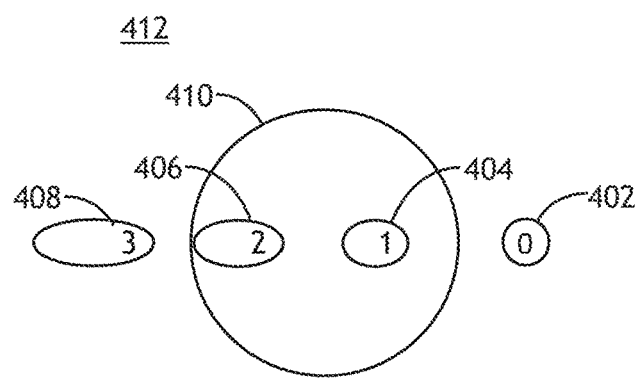
FIG. 4B is a top view of a collection pupil illustrating diffraction orders generated based on an illumination beam with relatively low temporal coherence and relatively high spatial coherence, in accordance with one or more embodiments of the present disclosure.
Figure 4C:
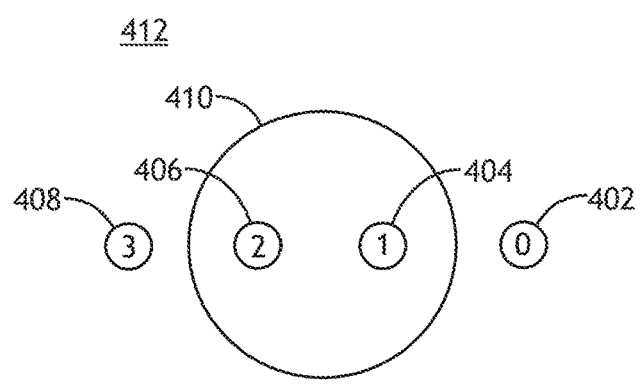
FIG. 4C is a top view of a collection pupil illustrating a balancing of the spatial and temporal coherence of an illumination beam, in accordance with one or more embodiments of the present disclosure.

Referring now to FIGS. 4A through 4C, the influence of illumination coherence (e.g., coherence of the illumination beam 114) on diffraction orders is described in greater detail in accordance with one or more embodiments of the present disclosure. Illuminating the overlay target 302 with the illumination beam 114 from each azimuthal angle relative to a surface normal of the sample 104 may generate specularly reflected light 402 (e.g., zero-order diffraction), a first diffraction order 404, a second diffraction order 406, a third diffraction order 408, and so on in a plane of incidence associated with the azimuthal angle. Various configurations of the overlay target 302 and the imaging tool 102 may provide for the collection of selected diffraction orders. In particular, diffraction orders falling within a boundary 410 of the collection pupil 412 may be collected and those falling outside the boundary 410 may not be collected. Further, the imaging tool 102 may include any number of stops or apertures to selectively block any collected diffraction orders.

FIG. 4A is a top view of a collection pupil 412 illustrating diffraction orders generated based on an illumination beam 114 with relatively high temporal coherence and relatively low spatial coherence, in accordance with one or more embodiments of the present disclosure. FIG. 4B is a top view of a collection pupil 412 illustrating diffraction orders generated based on an illumination beam 114 with relatively low temporal coherence and relatively high spatial coherence, in accordance with one or more embodiments of the present disclosure.

As illustrated in FIGS. 4A and 4B, adjusting the spatial coherence may primarily (though not exclusively) impact the size of diffraction orders in the collection pupil 412, while adjusting the temporal coherence may primarily (though not exclusively) impact the shape of the diffraction orders in the collection pupil 412. In particular, increasing the spectral bandwidth of the illumination beam 114 may lead to a spreading of the diffraction order in the plane of incidence due to the dependence of diffraction angle on wavelength.

FIG. 4C is a top view of a collection pupil 412 illustrating a balancing of the spatial and temporal coherence of an illumination beam 114 to provide localized and symmetric distributions in the collection pupil 412, in accordance with one or more embodiments of the present disclosure. As illustrated in FIG. 4C, the spatial and temporal coherence may be selected to provide approximately circular diffraction orders throughout the collection pupil 412. However, a symmetric distribution of non-circular diffraction orders may be generated using opposing illumination channels 116. For example, asymmetries introduced by the spectrum of the illumination beam 114 in one illumination channel 116 (e.g., to reduce the impact of speckle introduced by spatial coherence) may be mitigated through the use of an opposing illumination channel 116.

It is contemplated herein that the spatial and/or temporal coherence of the illumination beam 114 in any illumination channel 116 may be adjusted to provide a desired size and/or shape of collected diffraction orders in the collection pupil 412 of the imaging tool 102. It is contemplated herein that high spatial coherence may localize the regions of the collection pupil 412 sampled by target diffraction and minimizes sensitivities to aberrations and defocus. However, speckle, which reduces measurement precision, is introduced when spatial coherence is too high. Accordingly, the spatial coherence of each illumination beam 114 may be controlled to balance the localization in the collection pupil 412 and speckle. Similarly, high temporal coherence (narrow spectral bandwidth) may localize the regions of the collection pupil 412 sampled by target diffraction and minimize shifts in the sampled pupil locations due to spectral shifts in diffraction introduced by wafer process variations. However, the contrast of speckle introduced by spatial coherence can be reduced by reducing temporal coherence (broadening spectral bandwidth). In this regard, the temporal coherence may be controlled to balance the localization in the collection pupil 412 and the impact of speckle.

Referring now to FIGS. 5A through 7B, dark-field imaging using non-zero diffraction orders generated by a symmetric illumination profile is described in greater detail in accordance with one or more embodiments of the present disclosure.

In one embodiment, the overlay target 302 and the imaging tool 102 are co-optimized to provide that a distribution of light in a collection pupil 412 of the imaging tool 102 (e.g., a pupil-plane distribution) is symmetric about the optical axis 134 of the collection pathway 122 of the imaging tool 102. In the context of the present disclosure, the term symmetric distribution may refer to positional symmetry of diffraction orders and/or intensity symmetry across the collection pupil 412. In one embodiment, diffraction orders from the overlay target 302 are symmetrically distributed in the collection pupil 412. In another embodiment, the intensity distribution of the collected diffraction orders from the overlay target 302 is symmetric with respect to the optical axis 134. Further, as described previously herein, a symmetric distribution in the collection pupil 412 may be generated based on simultaneous or sequential illumination from opposing azimuthal angles.

Figure 5D:
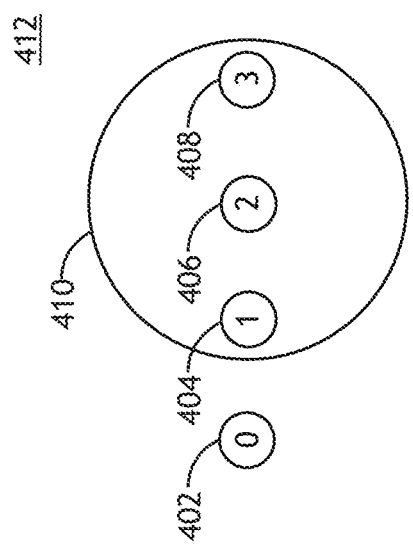
FIG. 5D is a top view of a distribution of diffracted orders in a collection pupil of the dark-field imaging tool configured according to FIG. 5C, in accordance with one or more embodiments of the present disclosure.
Figure 5C:
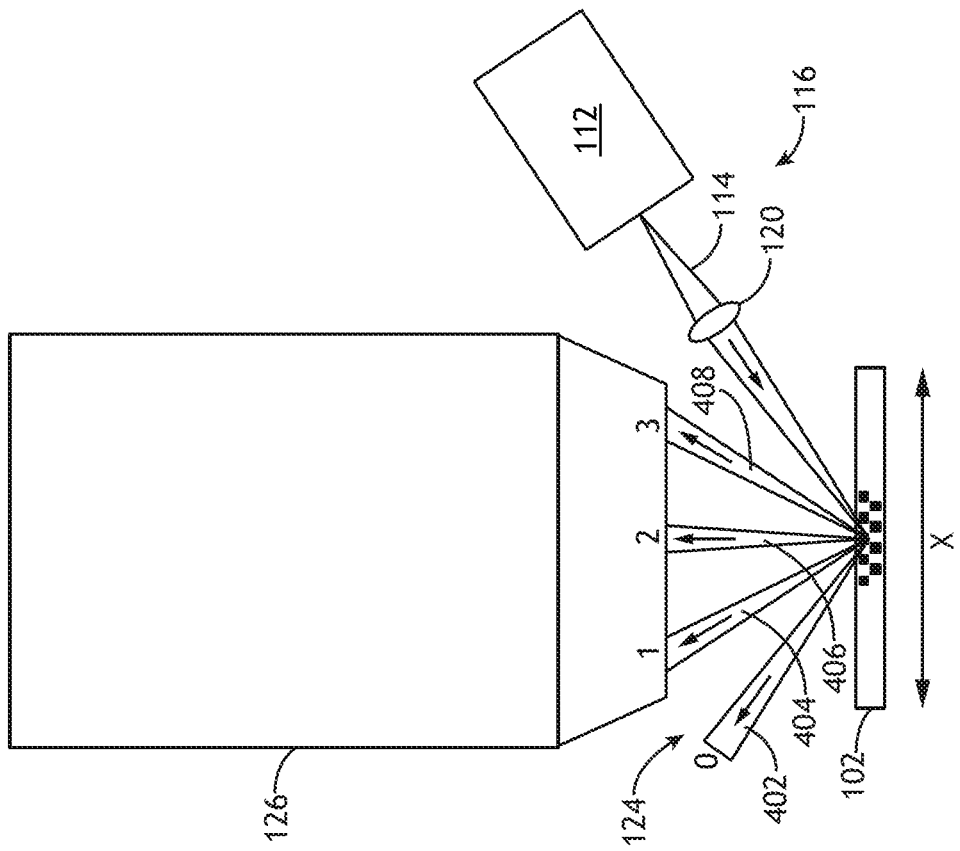
FIG. 5C is a conceptual view of the dark-field imaging tool configured to collect three symmetric diffraction orders from an overlay target, in accordance with one or more embodiments of the present disclosure.

Further, a symmetric pupil-plane distribution may include any number of collected diffraction orders. FIG. 5A is a conceptual view of the imaging tool 102 configured to collect three symmetric diffraction orders from an overlay target 302 associated with a first azimuthal angle oriented along the X direction, in accordance with one or more embodiments of the present disclosure. FIG. 5B is a top view of a distribution of diffracted orders in a collection pupil 412 of the imaging tool 102 configured according to FIG. 5A, in accordance with one or more embodiments of the present disclosure. FIG. 5C is a conceptual view of the imaging tool 102 configured to collect three symmetric diffraction orders from an overlay target 302 associated with a second azimuthal angle oriented along the X direction opposite the first azimuthal angle in FIG. 5A, in accordance with one or more embodiments of the present disclosure. FIG. 5D is a top view of a distribution of diffracted orders in a collection pupil 412 of the imaging tool 102 configured according to FIG. 5C, in accordance with one or more embodiments of the present disclosure.

In FIGS. 5A-5D, a first diffraction order 404, a second diffraction order 406, and a third diffraction order 408 are symmetrically distributed in the collection pupil 412 about the optical axis 134 along the plane of incidence. The reflected light 402 (e.g., zero-order diffraction) is not collected by the objective lens 126 and is shown in FIGS. 5B and 5D as falling outside a boundary 410 of the collection pupil 412 and thus does not contribute to the formation of an image of the overlay target 302.

Figure 6D:
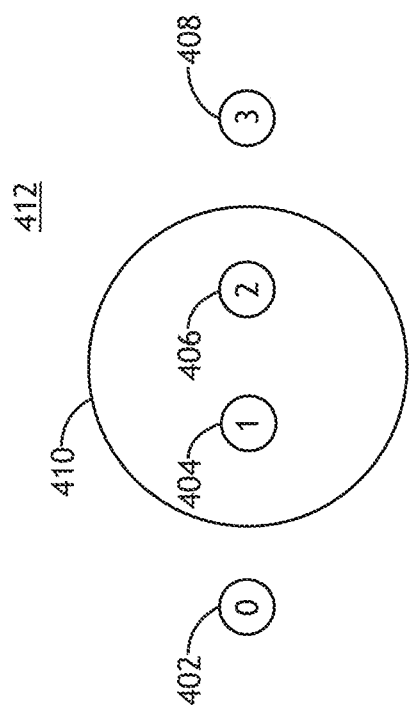
FIG. 6D is a top view of a collection pupil of the dark-field imaging tool configured according to FIG. 6C, in accordance with one or more embodiments of the present disclosure.
Figure 6C:
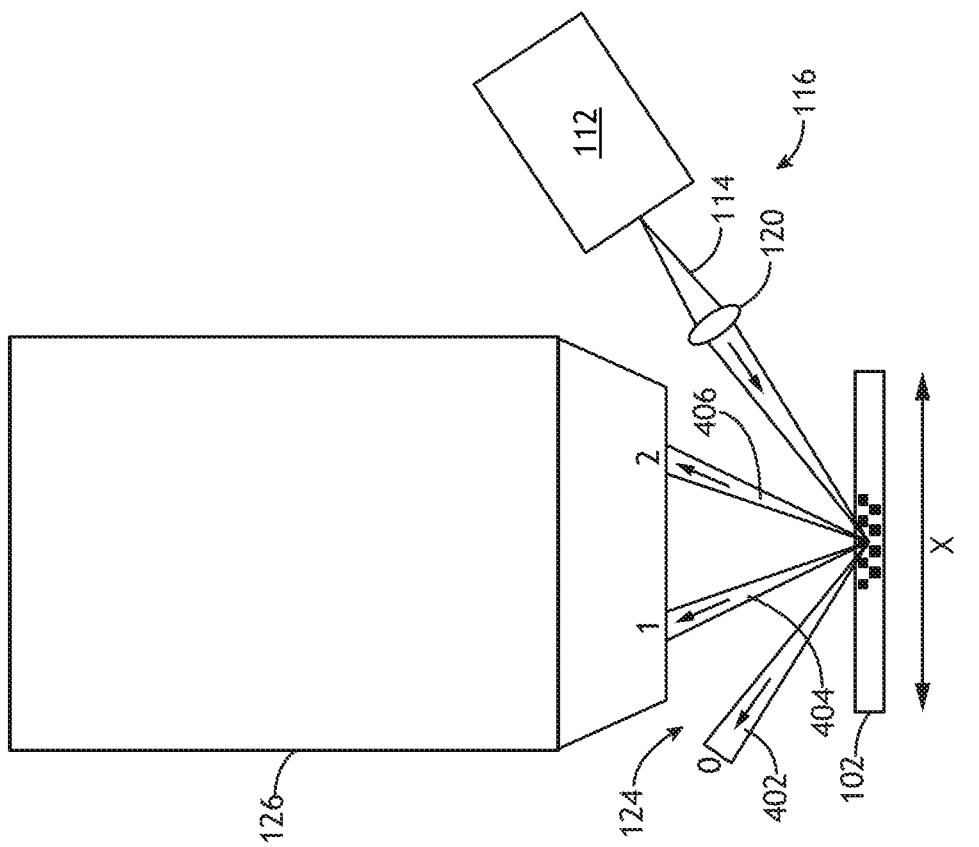
FIG. 6C is a conceptual view of the dark-field imaging tool configured to collect two symmetric diffraction orders from an overlay target, in accordance with one or more embodiments of the present disclosure

FIG. 6A is a conceptual view of the imaging tool 102 configured to collect two symmetric diffraction orders from an overlay target 302 associated with a first azimuthal angle oriented along the X direction, in accordance with one or more embodiments of the present disclosure. FIG. 6B is a top view of a collection pupil 412 of the imaging tool 102 configured according to FIG. 6A, in accordance with one or more embodiments of the present disclosure. FIG. 6C is a conceptual view of the imaging tool 102 configured to collect two symmetric diffraction orders from an overlay target 302 associated with a second azimuthal angle oriented along the X direction opposite the first azimuthal angle in FIG. 6A, in accordance with one or more embodiments of the present disclosure. FIG. 6D is a top view of a collection pupil 412 of the imaging tool 102 configured according to FIG. 6C, in accordance with one or more embodiments of the present disclosure.

In FIGS. 6A and 6C, the first diffraction order 404 and the second diffraction order 406 are symmetrically distributed in the collection pupil 412 about the optical axis 134 along the plane of incidence. The reflected light 402 (e.g., zero-order diffraction) and the third diffraction order 408 are not collected by the objective lens 126 and are shown in FIGS. 6B and 6D as falling outside the boundary 410 of the collection pupil 412 and thus do not contribute to the formation of an image of the overlay target 302.

As described previously herein, coherent dark-field imaging with two symmetric diffraction orders may be well suited for, but not limited to, overlay on samples formed from bonded wafers. Features of an overlay target 302 on such a sample are on or near the interface between the two wafers such that imaging the overlay target requires propagating the illumination beam 114 through the thickness of both wafers (e.g., through both wafers in transmission-mode imaging and through a single wafer twice in reflection-mode imaging). For a sample formed from thick semiconductor wafers (e.g., approximately 0.75 mm) having a relatively high index of refraction, this configuration is particularly susceptible to optical aberrations such as, but not limited to, spherical aberration (e.g., as illustrated in FIG. 2B). However, as described previously herein, coherent dark-field imaging with two symmetric diffraction orders may be relatively insensitive to such associated aberrations.

Further, coherent dark-field imaging may be robust to the strong reflections at the air/wafer interface (e.g., approximately 31% at normal incidence) since the imaging tool 102 does not capture (or otherwise blocks) the 0-order signal.

A distribution of diffracted orders from the overlay target 302 in the collection pupil 412 of the imaging tool 102 is generally a function of the properties of the overlay target 302 as well as parameters of the imaging tool 102. For example, the distribution of diffracted orders from the overlay target 302 in the collection pupil 412 may be a function of layout design parameters of the overlay target 302 including as, but not limited to, the period 308 or the duty cycle of target features (e.g., the first-layer features 304 and the second-layer features 306). By way of another example, the distribution of diffracted orders from the overlay target 302 in the collection pupil 412 may be a function of measurement parameters of the imaging tool 102 including, but not limited to, the wavelength of the illumination beam 114, the angle of incidence of the illumination beam 114, and the NA of the imaging tool 102. Accordingly, any combination of parameters of the overlay target 302 or the imaging tool 102 may be selected to provide a selected distribution of diffraction orders in the collection pupil 412.

For instance, the distribution of collected orders in the collection pupil 412 may be adjusted based on the selection of parameters such as, but not limited to, the period 308 of features of the overlay target 302 (e.g., the first-layer features 304 and the second-layer features 306), the wavelength of the illumination beam 114, or the angle of incidence of the illumination beam 114. In another instance, the relative intensity of diffracted orders generated by features with a particular period 308 may be adjusted based on the selection of parameters such as, but not limited to, the duty cycle of the features of the overlay target 302.

Additionally, as described previously herein, the imaging tool 102 may generate a symmetric illumination profile along selected measurement directions using a variety of techniques. For example, the imaging tool 102 may include opposing illumination channels 116 along selected measurement directions (e.g., the X direction as illustrated in FIGS. 5A-6D). By way of another example, the imaging tool 102 may include a single illumination channel 116 providing multi-pole or annular illumination.

Further, the parameters of each illumination channel 116 may be independently controlled or may be designed to match one or more other illumination beams 114. For example, parameters such as, but not limited to, a central wavelength, a spectrum, an angle of incidence, or a polarization of the illumination beam 114 may be independently controlled for each illumination channel 116. However, two or more illumination channels 116 may be configured to have at least one common parameter. For instance, it may be desirable that opposing illumination channels 116 have the same central wavelength and/or spectral bandwidth to provide a symmetric pupil-plane distribution.

The co-optimization of the overlay target 302 and the imaging tool 102 to provide a symmetric distribution of light in the collection pupil 412 may be carried out using a variety of techniques. In one embodiment, the parameters of one or more instances of an overlay target 302 on a sample 104 are fixed or otherwise known. Accordingly, the parameters of the imaging tool 102 are selected, either in an initial setup procedure or as part of a measurement recipe, to achieve a desired distribution of light in the collection pupil 412. Further, different instances of the overlay target 302 on the sample 104 may have, but are not required to have, different parameters such that different configurations of the imaging tool 102 may be implemented on a target-by-target basis to provide a selected pupil-plane distribution for each overlay target 302. In another embodiment, the parameters of the imaging tool 102 are fixed or otherwise constrained. Accordingly, the parameters of the overlay target 302 may be selected based on the known parameters of the imaging tool 102 to provide a selected distribution of light in the collection pupil 412. In another embodiment, the parameters of the overlay target 302 and the imaging tool 102 are selected in a common design process. For example, the illumination angle of the illumination beam 114, the wavelength of the illumination beam 114, and/or the period 308 may be selected to provide a selected distribution of diffraction orders in the collection pupil 412. Then, the duty cycle of the target features of the overlay target 302 may be selected to provide a selected intensity distribution across the collection pupil 412.

Further, parameters of any illumination channel 116 may be configured prior to measurements as a one-time optimization or may be adjusted before any selected measurement. For example, the overlay metrology system 100 may monitor the distribution of light in the collection pupil 412 at any point (e.g., prior to a measurement, at periodic intervals, or the like) to modify parameters of any illumination channel 116 to provide a symmetric pupil-plane distribution.

Further, in FIGS. 4A through 6D, the imaging tool 102 is illustrated as providing symmetric illumination along a single axis using two separate illumination sources in an OTL configuration. However, it is to be understood that these examples are provided solely for illustrative purposes and should not be interpreted as limiting. For example, the imaging tool 102 may provide a symmetric illumination profile along any number of measurement directions such as, but not limited to, a dipole illumination profile, a quadrupole illumination profile, or an annular illumination profile. This symmetric illumination profile may be generated through simultaneous or sequential illumination of opposing azimuthal angles using one or more illumination sources 112 (or channels). By way of another example, the illumination source 112 may be configured in any manner including, but not limited to, the configurations illustrated in FIGS. 1B-1D. In this regard, the symmetric illumination profile may be generated using any combination of OTL and TTL configurations in reflection or transmission mode.

In another embodiment, the overlay target 302 and the imaging tool 102 are co-optimized to provide that no collected diffracted orders are truncated in the collection pupil 412. In this regard, all diffracted orders are either fully within or fully outside of the boundary 410 of the collection pupil 412.

Figure 7B:
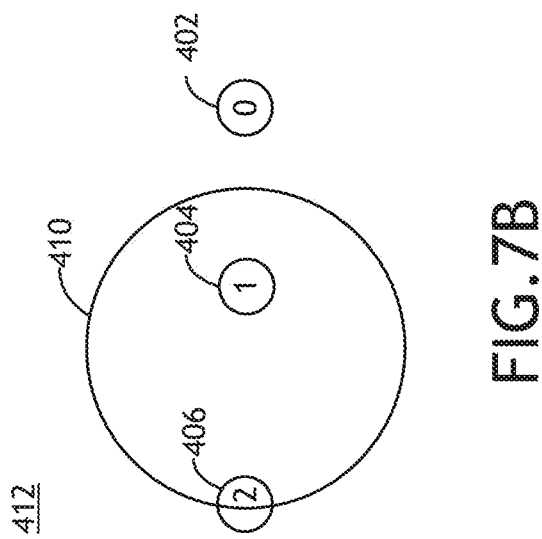
FIG. 7B is a top view of a collection pupil of the dark-field imaging tool configured according to FIG. 7A, in accordance with one or more embodiments of the present disclosure.
Figure 7A:
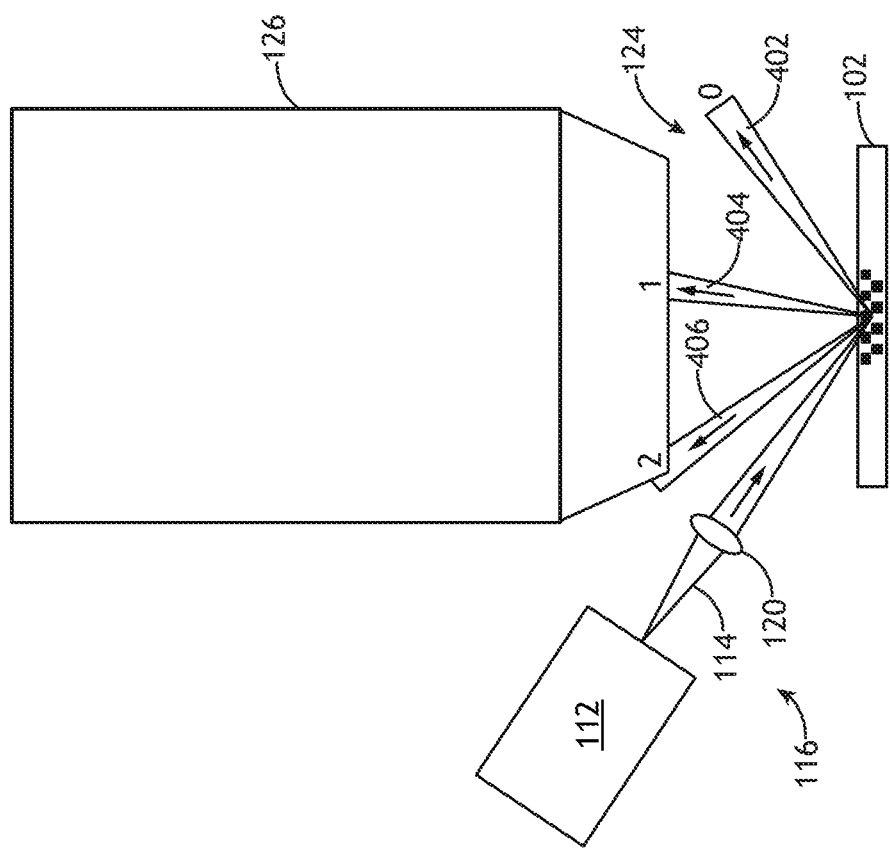
FIG. 7A is a conceptual view of the dark-field imaging tool illustrating a configuration in which a diffraction order is truncated in the collection pupil, in accordance with one or more embodiments of the present disclosure.

FIG. 7A is a conceptual view of the imaging tool 102 illustrating a configuration in which a diffraction order is truncated in the collection pupil 412, in accordance with one or more embodiments of the present disclosure. FIG. 7B is a top view of a collection pupil 412 of the imaging tool 102 configured according to FIG. 7A, in accordance with one or more embodiments of the present disclosure. In FIGS. 7A and 7B, the second diffraction order 406 is only partially collected by the objective lens 126 such that the second diffraction order 406 straddles the boundary 410 of the collection pupil 412. In contrast, FIGS. 4A through 6B illustrated configurations with no truncated diffraction orders.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
    an illumination sub-system comprising:
        one or more illumination sources; and
        one or more illumination optics to illuminate a metrology target on a sample with illumination having a symmetric off-axis illumination profile, wherein the symmetric off-axis illumination profile is symmetric along one or more measurement directions, wherein the illumination sub-system provides the illumination from opposing angles in the symmetric off-axis illumination profile at least one of simultaneously or sequentially, wherein the metrology target includes a first periodic structure on a first layer of the sample and a second periodic structure on a second layer of the sample;
    an imaging sub-system comprising:
        an objective lens; and
        a detector to collect light from the metrology target with the objective lens and generate one or more images of the metrology target, wherein a collection pupil of the imaging sub-system exclusively passes two non-zero diffraction orders of a common sign from any of the opposing angles of the symmetric off-axis illumination profile to the detector for generating the one or more images of the metrology target, wherein a combined distribution in the collection profile associated with the two non-zero diffraction orders from the opposing angles of the symmetric off-axis illumination profile collected at least one of simultaneously or sequentially is symmetric; and
    a controller communicatively coupled to the imaging sub-system, wherein the controller includes one or more processors configured to execute program instructions causing the one or more processors to:
        receive the one or more images of the metrology target from the imaging sub-system associated with the illumination of the metrology target with the symmetric off-axis illumination profile; and
        determine an overlay error indicative of alignment between the first layer and the second layer based on the one or more images.

2. The metrology system of claim 1, wherein the illumination sub-system provides the illumination from the opposing angles in the symmetric off-axis illumination profile simultaneously, wherein the symmetric collection profile is generated simultaneously.

3. The metrology system of claim 1, wherein the illumination sub-system provides the illumination from the opposing angles in the symmetric off-axis illumination profile sequentially, wherein the symmetric collection profile is generated sequentially and is associated with combined collection profiles from the illumination with the opposing angles in the symmetric off-axis illumination profile.

4. The metrology system of claim 1, wherein the symmetric off-axis illumination profile comprises:
at least one of a dipole illumination profile, a quadrupole illumination profile, or an annular illumination profile.

5. The metrology system of claim 1, wherein at least one of a wavelength of the illumination, one or more illumination angles in the symmetric off-axis illumination profile, or periods of the first or second periodic structures are selected to provide a symmetric intensity distribution in the collection pupil of the imaging sub-system.

6. The metrology system of claim 1, wherein the two non-zero diffraction orders from each of the opposing angles of the symmetric off-axis illumination profile comprise:
non-zero diffraction orders based on reflection from the metrology target.

7. The metrology system of claim 6, wherein the illumination sub-system includes an illumination lens to direct the illumination in the symmetric off-axis illumination profile to the metrology target at one or more angles outside a numerical aperture of the objective lens.

8. The metrology system of claim 6, wherein the illumination sub-system directs the illumination beam to the metrology target through the objective lens.

9. The metrology system of claim 8, wherein the metrology system further comprises:
one or more stops to block at least zero-order diffraction from the light from the metrology target collected by the objective lens.

10. The metrology system of claim 1, wherein the two non-zero diffraction orders from each of the opposing angles of the symmetric off-axis illumination profile comprise:
non-zero diffraction orders based on transmission through the metrology target.

11. The metrology system of claim 1, wherein the two non-zero diffraction orders of the opposing angles of the symmetric off-axis illumination profile comprise:
first-order diffraction and second-order diffraction.

12. The metrology system of claim 1, wherein at least one of a spatial coherence or a temporal coherence of the illumination in the symmetric off-axis illumination profile is selected to provide that the two non-zero diffraction orders from each of the opposing angles of the symmetric off-axis illumination profile are fully within the collection pupil of the imaging sub-system.

13. The metrology system of claim 1, wherein the first layer and the second layer are disposed on a common wafer.

14. The metrology system of claim 1, wherein the sample includes a first wafer and a second wafer bonded at an interface, wherein the first layer is on the first wafer, wherein the second layer is on the second wafer.

15. The metrology system of claim 1, wherein the first periodic structure and the second periodic structure have a common period.

16. A metrology system comprising:
a multi-channel illumination source comprising:
one or more illumination sources configured to generate two or more illumination beams in two or more illumination channels, wherein the two or more illumination beams are arranged to illuminate a metrology target on a sample in a symmetric off-axis illumination profile, wherein the two or more illumination beams are oriented to be symmetric along one or more measurement directions, wherein the two or more illumination beams illuminate the metrology target with the symmetric off-axis illumination profile at least one of simultaneously or sequentially, wherein the metrology target includes a first periodic structure on a first layer of the sample and a second periodic structure on a second layer of the sample;
an objective lens configured to collect light from the metrology target in response to the two or more illumination beams;
an imaging sub-system comprising:
the objective lens; and
a detector configured to generate one or more images of the metrology target, wherein a collection pupil of the imaging sub-system exclusively passes two non-zero diffraction orders of a common sign from any of the two or more illumination beams to the detector for generating the one or more images of the metrology target, wherein a combined distribution in the collection pupil associated with the two non-zero diffraction orders from the opposing angles of the symmetric off-axis illumination profile collected at least one of simultaneously or sequentially is symmetric; and
a controller communicatively coupled to the imaging sub-system, wherein the controller includes one or more processors configured to execute program instructions causing the one or more processors to:
receive the one or more images of the metrology target from the imaging sub-system; and
determine an overlay error indicative of alignment between the first layer and the second layer based on the one or more images.

17. The metrology system of claim 16, wherein the two or more illumination beams illuminate the metrology target with the symmetric off-axis illumination profile simultaneously, wherein the symmetric collection profile is generated simultaneously.

18. The metrology system of claim 16, wherein the two or more illumination beams illuminate the metrology target with the symmetric off-axis illumination profile sequentially, wherein the symmetric collection profile is generated sequentially and is associated with combined collection profiles from illumination with illumination beams of the two or more illumination beams at opposing angles.

19. The metrology system of claim 16, wherein at least some of the two or more illumination beams have different wavelengths.

20. The metrology system of claim 16, wherein the symmetric off-axis illumination profile comprises:
at least one of a dipole illumination profile, a quadrupole illumination profile, or an annular illumination profile.

21. The metrology system of claim 16, wherein the two non-zero diffraction orders from each of the two or more illumination beams comprise:
non-zero diffraction orders based on reflection from the metrology target.

22. The metrology system of claim 21, wherein the two or more illumination beams illuminate the metrology target with the symmetric off-axis illumination profile outside a numerical aperture of the objective lens.

23. The metrology system of claim 21, wherein the two or more illumination beams illuminate the metrology target with the symmetric off-axis illumination profile through the objective lens.

24. The metrology system of claim 23, wherein the metrology system further comprises:
one or more stops to block at least zero-order diffraction from the light from the metrology target collected by the objective lens.

25. The metrology system of claim 16, wherein the two non-zero diffraction orders from each of the two or more illumination beams comprise:
non-zero diffraction orders based on transmission through the metrology target.

26. The metrology system of claim 16, wherein the two non-zero diffraction orders from each of the two or more illumination beams comprise:
first-order diffraction and second-order diffraction.

27. The metrology system of claim 16, wherein at least one of a spatial coherence or a temporal coherence of illumination in the symmetric off-axis illumination profile is selected to provide that the two non-zero diffraction orders from each of the two or more illumination beams are fully within the collection pupil of the imaging sub-system.

28. The metrology system of claim 16, wherein the first layer and the second layer are disposed on a common wafer.

29. The metrology system of claim 16, wherein the sample includes a first wafer and a second wafer bonded at an interface, wherein the first layer is on the first wafer, wherein the second layer is on the second wafer.

30. The metrology system of claim 16, wherein the first periodic structure and the second periodic structure have a common period.

31. A metrology method comprising:
illuminating a metrology target on a sample with illumination having a symmetric off-axis illumination profile, wherein the symmetric off-axis illumination profile is symmetric along one or more measurement directions, wherein the symmetric off-axis illumination profile is directed to the metrology target at least one of simultaneously or sequentially, wherein the metrology target includes a first periodic structure on a first layer of the sample and a second periodic structure on a second layer of the sample;
generating one or more images of the metrology target to a detector, wherein a collection pupil prior to the detector exclusively passes two non-zero diffraction orders of a common sign from any of the opposing angles of the symmetric off-axis illumination profile to the detector for generating the one or more images of the metrology target, wherein a combined distribution in the collection pupil associated with the two non-zero diffraction orders from the opposing angles of the symmetric off-axis illumination profile collected at least one of simultaneously or sequentially is symmetric; and
determining, with one or more processors, an overlay error indicative of alignment of the first wafer and the second layer based on the one or more images.

* * * * *